(12) United States Patent
Maimon et al.

(10) Patent No.: US 6,529,403 B2
(45) Date of Patent: Mar. 4, 2003

(54) INTEGRATED RESISTOR HAVING ALIGNED BODY AND CONTACT AND METHOD FOR FORMING THE SAME

(75) Inventors: Jonathan Maimon, Manassas, VA (US); Murty S. Polavarapu, Vienna, VA (US)

(73) Assignee: BAE Systems Information and Electronic Systems Integration, Inc., Manassas, VA (US)

(*) Notice: Subject to any disclaimer, the term of this patent is extended or adjusted under 35 U.S.C. 154(b) by 0 days.

(21) Appl. No.: 10/125,843

(22) Filed: Apr. 19, 2002

(65) Prior Publication Data

US 2002/0119635 A1 Aug. 29, 2002

Related U.S. Application Data

(62) Division of application No. 09/760,178, filed on Jan. 12, 2001, now Pat. No. 6,455,392.
(60) Provisional application No. 60/178,247, filed on Jan. 21, 2000.

(51) Int. Cl.$^7$ ........................... G11C 11/00; H01L 21/20
(52) U.S. Cl. ................... 365/154; 365/156; 438/382; 438/385

(58) Field of Search .................................. 438/382, 383, 438/384, 385; 365/154, 156

(56) References Cited

U.S. PATENT DOCUMENTS

| | | | |
|---|---|---|---|
| 4,560,419 A | 12/1985 | Bourassa et al. | 438/385 |
| 4,950,620 A * | 8/1990 | Harrington, III | 438/385 |
| 5,037,766 A | 8/1991 | Wang | 438/385 |
| 5,126,279 A | 6/1992 | Roberts | 438/385 |
| 5,185,285 A | 2/1993 | Hasaka | 438/385 |
| 5,212,108 A | 5/1993 | Liu et al. | 438/385 |
| 5,236,857 A | 8/1993 | Eklund et al. | 438/385 |
| 5,976,943 A | 11/1999 | Manley et al. | 438/382 |
| 6,127,217 A * | 10/2000 | Madurawe et al. | 438/382 |
| 6,130,462 A * | 10/2000 | Yang et al. | 438/382 |
| 6,133,084 A | 10/2000 | Chang et al. | 438/385 |
| 6,391,734 B1 * | 5/2002 | Rolfson et al. | 438/385 |

* cited by examiner

*Primary Examiner*—Trong Phan
(74) *Attorney, Agent, or Firm*—Daniel Long; Graybeal Jackson Haley LLP

(57) ABSTRACT

An integrated resistor includes a resistor body region and a resistor contact region that is aligned with the body region. Because the resistor includes an aligned body and contact, it often occupies a smaller area than prior integrated resistors having a similar resistance value. A method for forming such a resistor is also disclosed.

5 Claims, 10 Drawing Sheets

INTEGRATED RESISTOR HAVING ALIGNED BODY AND CONTACT AND METHOD FOR FORMING THE SAME

This is a divisional of the prior application Ser. No. 09/760,178, filed Jan. 12, 2001, now U.S. Pat. No. 6,455, 392, which claims priority from Ser. No. 60/178,247, filed Jan. 21, 2000, the benefit of the filing dates of which are hereby claimed under 35 USC 120.

TECHNICAL FIELD

The invention relates generally to integrated circuits and more particularly to an integrated resistor having a contact that is aligned with the resistor body and a method for forming the resistor.

BACKGROUND OF THE INVENTION

As their customers continue to demand new versions of integrated circuits (ICs) that are smaller and more functional than prior versions, IC manufacturers try to include more integrated components such as resistors, transistors, and capacitors per unit area of an IC die. One technique for achieving this result is to minimize the layout area that an integrated component occupies.

FIG. 4(c) of U.S. Pat. No. 5,236,857 entitled RESISTOR STRUCTURE AND PROCESS discloses an integrated resistor 10 having a resistor body 14 and resistor heads 16, which are low-resistance contacts for coupling the body 14 to other integrated components.

One problem with the integrated resistor 10 is that it occupies more than its optimal layout area, and thus may hinder a manufacturer's efforts to decrease the size of an IC that incorporates the resistor 10. Specifically, the optimal layout area of the resistor 10 is the area occupied by the heads 16 and the body 14 where the edges of the heads and body are aligned. To allow for potential misalignment during the manufacturing process, however, the manufacturer makes the body 14 significantly wider than the heads 16. Unfortunately, this widening of the body 14 increases the area of the resistor 10 beyond its optimal area. In addition, this widening tends to decrease the resistance of the resistor 10. Therefore, so that the resistor 10 has the desired resistance, the IC manufacture proportionally lengthens the body 14. Lengthening the body 14 tends to increase the resistance of the resistor 10, and thus counteracts the resistance decrease caused by the widening of the body 14. Unfortunately, this lengthening of the body 14 further increases the area of body 14, and thus further increases the area of the resistor 10 beyond its optimal area.

SUMMARY OF THE INVENTION

An integrated resistor includes a layer of semiconductor material having a first edge. A first region having a first conductivity is disposed in the layer contiguous with the first edge. A second region having a second conductivity is also disposed in the layer contiguous with both the first edge and with the first region, and the second conductivity is different than the first conductivity.

Because such a resistor can include an aligned body and contact, the resistor often occupies a smaller area than a prior integrated resistor having a similar resistance.

DETAILED DESCRIPTION OF THE INVENTION

Figure 1:
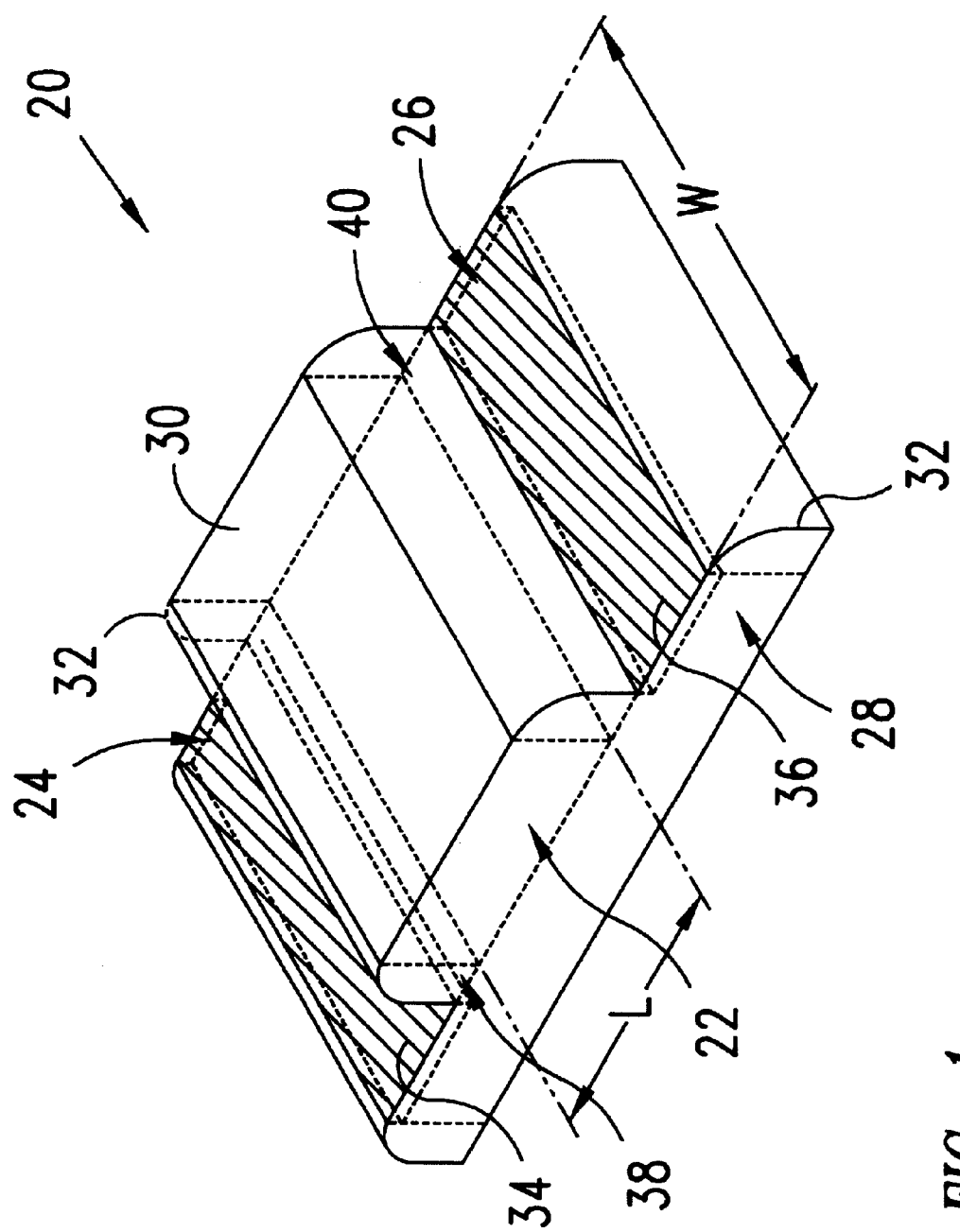
FIG. 1 is an isometric view of an integrated resistor according to an embodiment of the invention.

FIG. 1 is an isometric view of an integrated resistor 20 according to an embodiment of the invention. The resistor 20 includes a body region 22 and a pair of contact regions 24 and 26. As discussed below in conjunction with FIGS. 2–8, the contact regions 24 and 26 are aligned with the body region 22 such that the body region 22 has approximately the same width W as the contact regions 24 and 26. For example, the width W may equal the minimum feature size of the process used to form the resistor 20. Thus, for a given resistance and width W, the body region 22 is narrower than prior resistor body regions. In addition, this narrowing tends to increase the resistance of the body region 22, and thus allows one to shorten the length L of the region 22. Consequently, the layout area occupied by the resistor 20 is significantly smaller than the area occupied by prior integrated resistors.

Still referring to FIG. 1, the body region 22 and the contact regions 24 and 26 are disposed in a layer 28 of a semiconductor material such as polysilicon. An electrical insulator 30, which includes the remnant of a mask, is disposed on the body region 22. Dielectric sidewall spacers 32 are disposed adjacent to the sides of the semiconductor layer 28 and the insulator 30. To reduce contact resistance, the contact regions 24 and 26 include respective layers 34 and 36 of silicide. In one embodiment, the body region 22 has a resistance in the range of approximately 20 K$\Omega$–40 K$\Omega$ per square, and the suicide layers 34 and 36 have respective resistance values of approximately 5 $\Omega$ per square.

The resistor 20 may also include intermediate regions 38 and 40, which are disposed in the semiconductor layer 28 beneath the respective sidewall spacers 32 and which separate the regions 24 and 26 from the body region 22. In one embodiment, the intermediate regions 38 and 40 have respective resistance values of approximately 100 Ω per square.

Although the contact regions 24 and 26 extend from opposite sides of the body region 22 such that the illustrated embodiment of the resistor 20 is rectangular, the resistor 20 can have other shapes. For example, the regions 24 and 26 can extend from adjacent sides of the body region 22 such that the resistor 20 is "L" shaped.

FIGS. 2–8 illustrate a process for forming the resistor 20 of FIG. 1 according to an embodiment of the invention.

Figure 2:
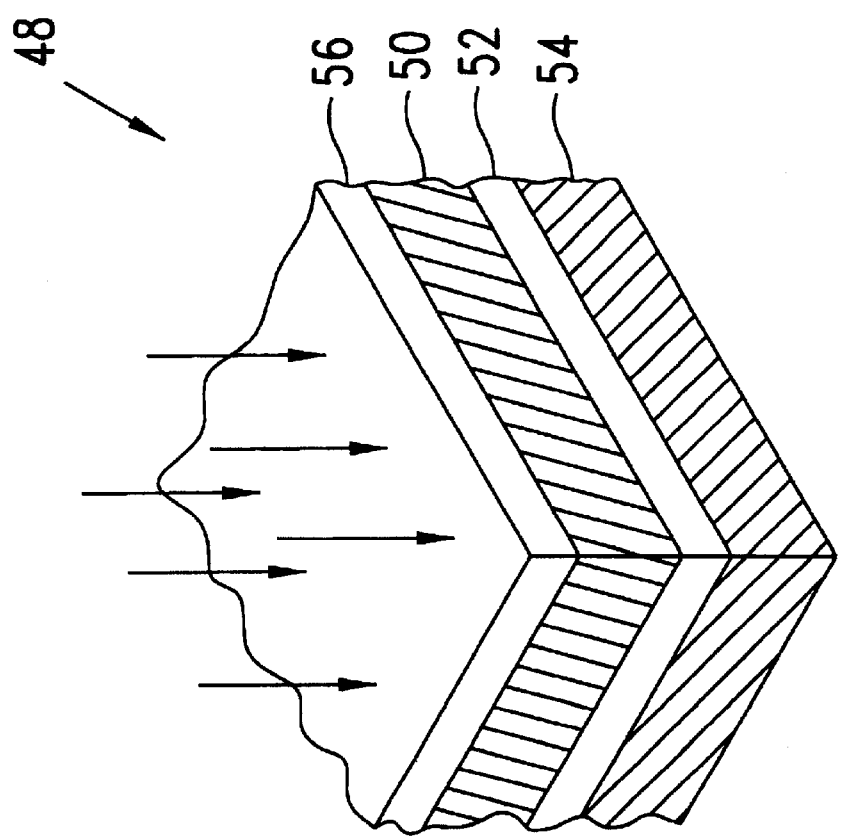
FIG. 2 is an isometric view of a semiconductor structure at a point in a process for forming the resistor of FIG. 1 according to an embodiment of the invention.

FIG. 2 is an isometric view of a semiconductor structure 48 at one point in a process for forming the resistor 20 of FIG. 1. A semiconductor layer 50 is conventionally formed on an insulator layer 52, which is disposed on a substrate 54. Next, an insulator layer 56 is conventionally formed on the semiconductor layer 50, and a dopant is conventionally implanted through the layer 56 and into the layer 50. This implanted dopant sets the resistance of the resistor body 22 of FIG. 1. Alternatively, the layer 50 may be doped before the layer 56 is formed. In one embodiment, the semiconductor layer 50 is a deposited polysilicon layer having a thickness of approximately 3000 Angstroms (Å), the layers 52 and 56 are deposited or thermally grown silicon oxide layers each having a thickness of approximately 100 Å, and the substrate 54 is formed from monocrystalline silicon. In addition, as discussed above in conjunction with FIG. 1, in this embodiment the implanted dopant sets the resistance of the semiconductor layer 50 to approximately 20 KΩ–40 KΩ per square. The dopant can be, e.g., arsenic or phosphorous to form an N-type resistor 20 or, e.g., boron to form a P-type resistor 20. In one embodiment, the dopant is arsenic, which is implanted at an energy of approximately 20–200 KeV and has a concentration of approximately $10^{14}$–$10^{15}$ ions/cm$^2$.

Figure 3:
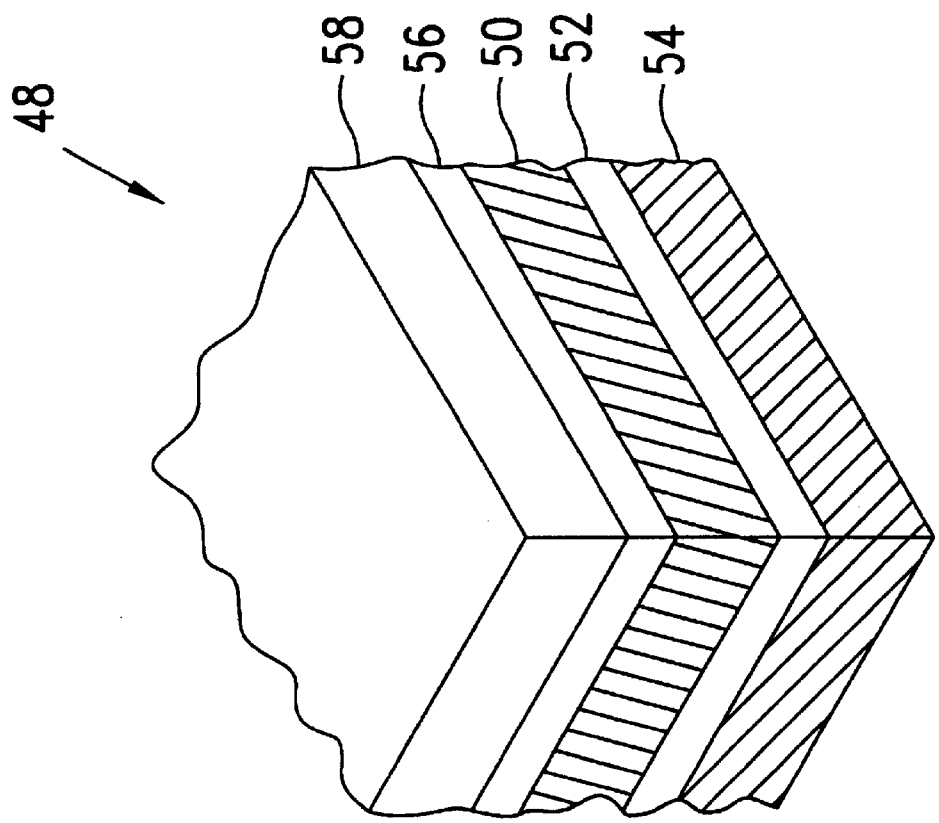
FIG. 3 is an isometric view of the structure of FIG. 2 at a subsequent point in the process for forming the resistor of FIG. 1.

Referring to FIG. 3, a first mask layer 58 is conventionally formed on the insulator layer 56. Alternatively, the layer 56 can be conventionally removed and replaced with another insulator layer (not shown) before the layer 58 is formed. Or, the layer 56 can be removed and the layer 58 formed directly on the semiconductor layer 50. In one embodiment, the layer 58 is a deposited layer of silicon nitride or silicon oxide and has a thickness of approximately 1000 Å.

Figure 4:
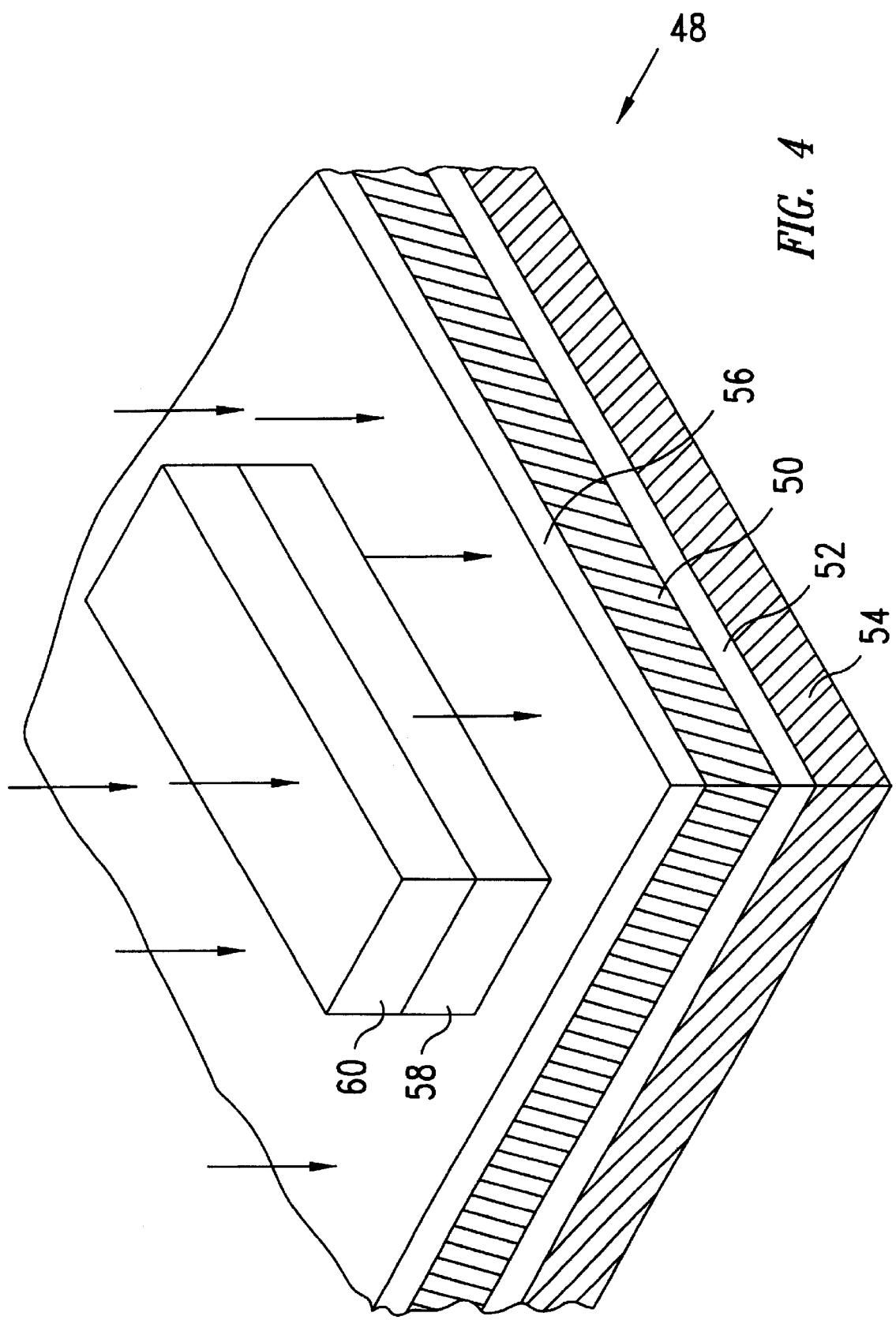
FIG. 4 is an isometric view of the semiconductor structure of FIG. 3 at a subsequent point in the process for forming the resistor of FIG. 1.

Referring to FIG. 4, a mask layer 60 is conventionally formed on the layer 58, and is conventionally patterned to mask the region of the layer 50 in which the resistor body 22 of FIG. 1 will be formed. The patterned region of the layer 60 has a larger area than the body region 22 to allow for misalignment tolerances in subsequent processing steps. Next, the exposed portions of the layer 58 are conventionally removed to form a first mask 58. The exposed portions of the layer 56 may also be removed and a replacement insulator layer (not shown) may be formed on the semiconductor layer 50. Then, a dopant is implanted into the exposed regions of the layer 50 to set the resistance of the resistor contact regions 24 and 26 of FIG. 1. This dopant may also set the conductivity of connectors and transistor gates (not shown) that are formed in the layer 50. The remaining portions of the mask layer 60 are removed either before or after the dopant implant. In one embodiment, the layer 60 is a deposited photoresist layer, the dopant is phosphorous or boron, and the resistance of the implanted regions of the layer 50 is approximately 100 Ω per square.

Figure 5:
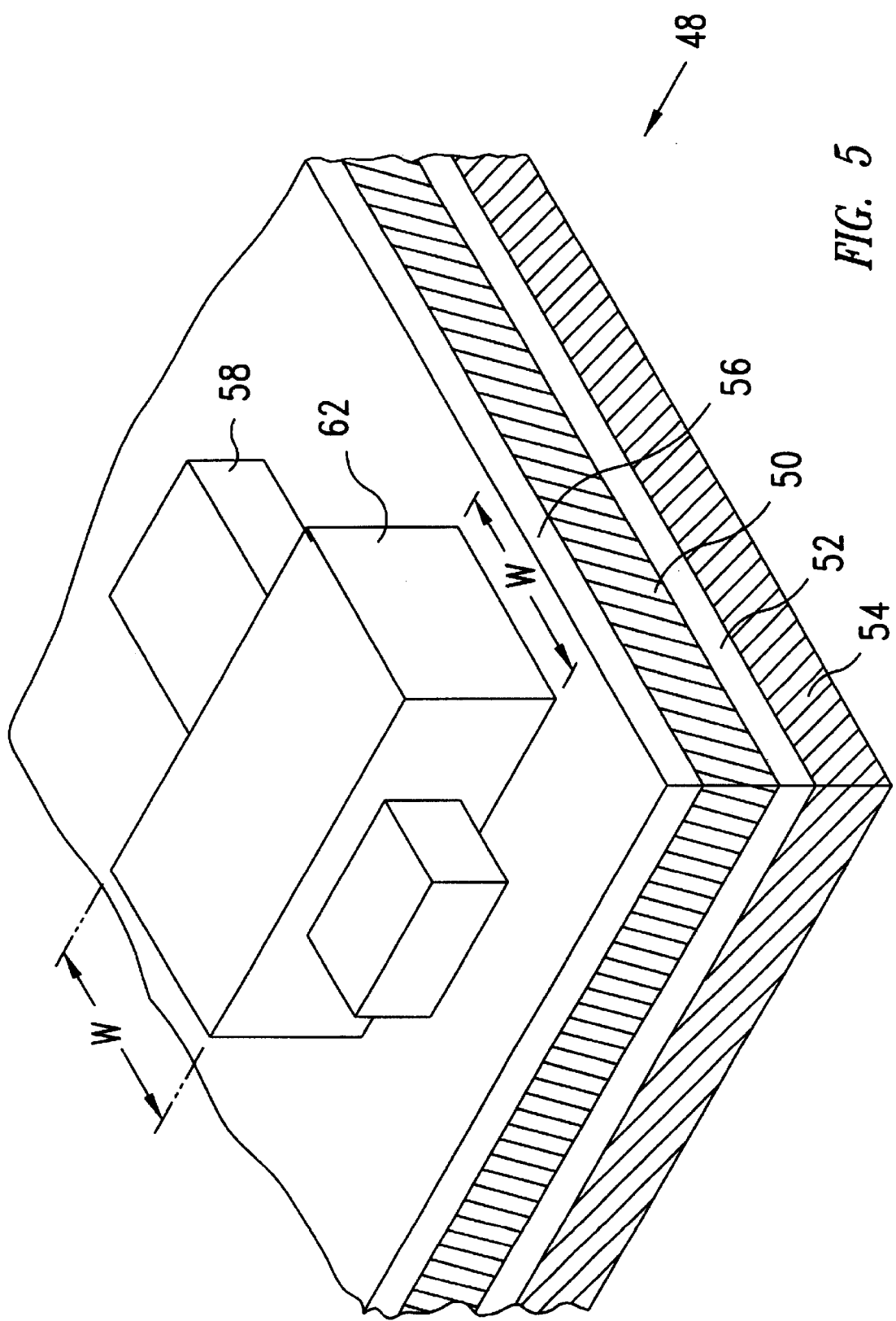
FIG. 5 is an isometric view of the semiconductor structure of FIG. 4 at a subsequent point in the process for forming the resistor of FIG. 1.

Referring to FIG. 5, a mask layer 62 is conventionally formed on the first mask 58 and the insulator layer 56 and is patterned to form a second mask 62. The mask 62 covers the region of the layer 50 in which the resistor 20 of FIG. 1 is to be formed, and thus has the same width W of the resistor 20. But as stated above, the first mask 58 is wider than the width W to account for relative misalignment between the masks 58 and 62. In one embodiment, the layer 62 is a deposited photoresist layer and the resulting patterned mask 62 covers not only the region of the layer 50 in which the resistor 20 is to be formed, but also covers the regions in which, e.g., transistor gates and connectors (not shown) are to be formed.

Still referring to FIG. 5, the exposed portions of the first mask 58 and the layers 50 and 56 are conventionally removed. In one embodiment the first mask 58 is a nitride, the layer 56 is an oxide, and the layer 50 is polysilicon. In a related removal process, the nitride mask 58 is first etched selective to the oxide layer 56, the oxide layer 56 is then etched selective to the polysilicon layer 50, and the polysilicon layer 50 is finally etched selective to the insulator layer 52. In another related removal process, both the nitride mask 58 and the oxide layer 56 are simultaneously etched selective to the polysilicon layer 50, and then the polysilicon layer 50 is etched selective to the insulator layer 52. In another embodiment, the first mask 58 and the layers 52 and 56 are oxides and the layer 50 is polysilicon. In a related removal process, the oxide mask 58 and the oxide layer 56 are simultaneously etched selective to the polysilicon layer 50, and then the layer 50 is etched selective to the oxide layer 52. In an alternative related removal process, a timed etch is implemented using an etchant that etches oxide more slowly than polysilicon such that after the exposed portions of the layer 50 are removed, a minimal thickness of the insulator layer 52 is removed before the process is halted.

Figure 6:
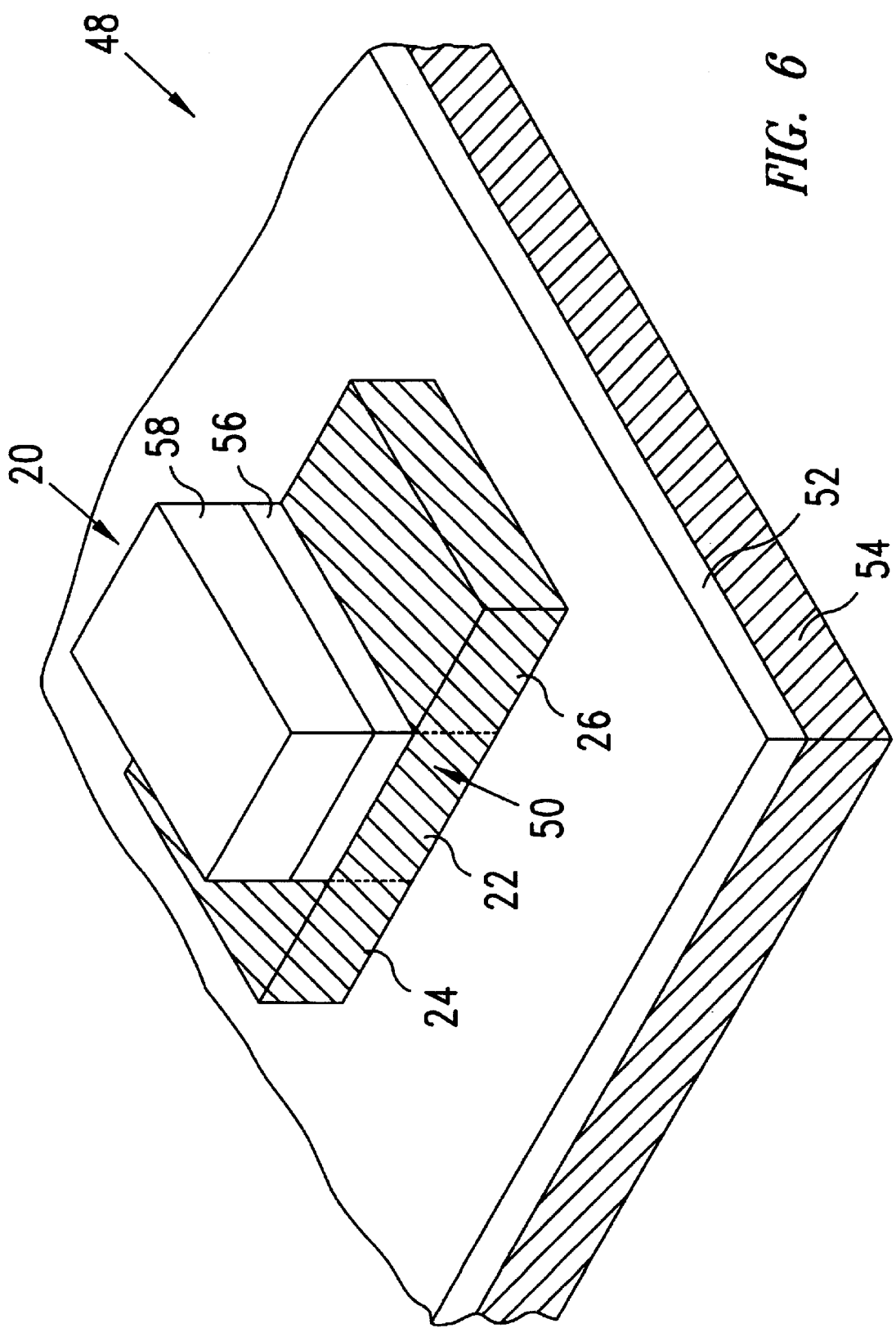
FIG. 6 is an isometric view of the semiconductor structure of FIG. 5 at a subsequent point in the process for forming the resistor of FIG. 1.

FIG. 6 is an isometric review of the structure 48 of FIG. 5 after the second mask 62 and the regions of the first mask 58 and the layers 50 and 56 exposed by the mask 62 have been conventionally removed. The region of the semiconductor layer 50 that underlies the remaining portion of the first mask 58 is the body portion 22 of the resistor 20 of FIG. 1, and the exposed regions of the layer 50 become the contact regions 24 and 26. As discussed above, the resistance of the body region 22 is set by the first dopant implant (FIG. 2), and the resistance of the contact regions 24 and 26 is set by the second dopant implant (FIG. 4). Furthermore, although not shown in FIG. 6, in one embodiment the body region 22 is formed over a field-oxide or trench-isolation region disposed in the substrate 54.

Figure 7:
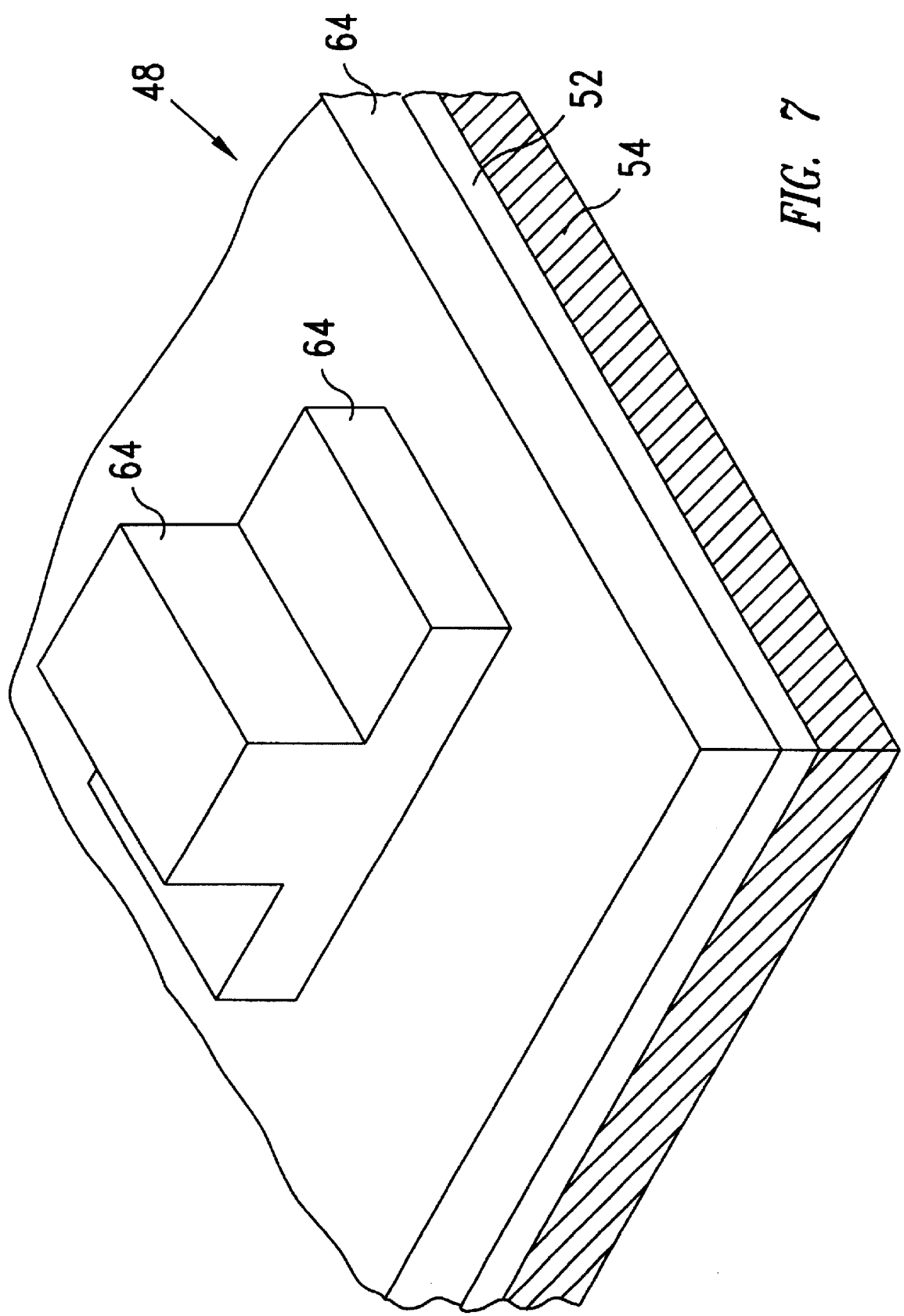
FIG. 7 is an isometric view of the semiconductor structure of FIG. 6 at a subsequent point in the process for forming the resistor of FIG. 1.

Referring to FIG. 7, an insulator layer 64 is conventionally formed over the structure 48 of FIG. 6. In one embodiment, the layer 64 is a deposited layer of silicon nitride.

Figure 8:
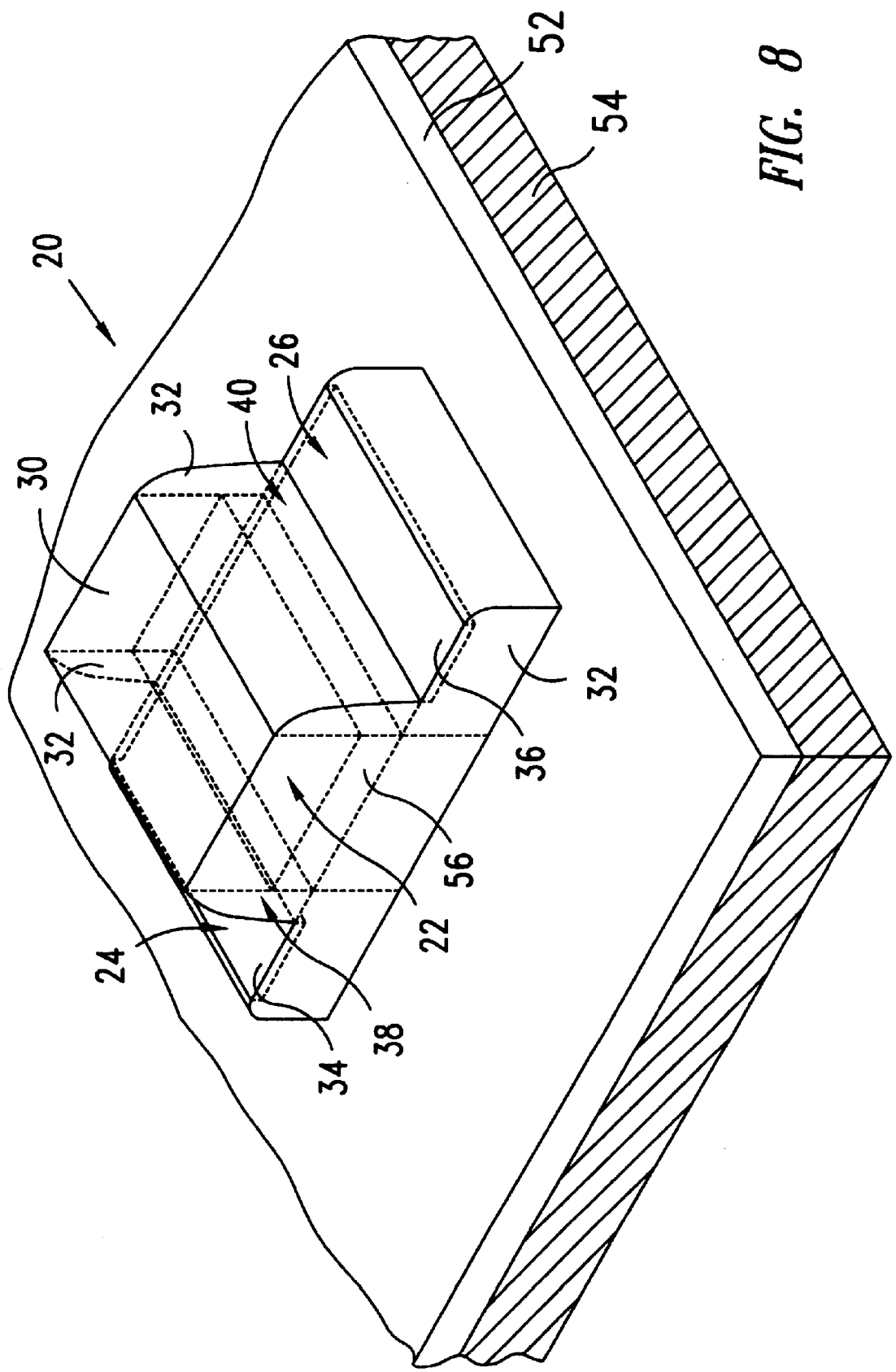
FIG. 8 is an isometric view of the semiconductor structure of FIG. 7 at a subsequent point in the process for forming the resistor of FIG. 1.

Referring to FIG. 8, dielectric spacers 32 are conventionally formed from the layer 64 of FIG. 7. In one embodiment, the layer 64 is subjected to a timed anisotropic etch such as a reactive ion etch to form the spacers 32. Alternatively, the layer 64 is subjected to an end-point-detection anisotropic etch that is halted when an exposed portion of the layer 52 or of one of the contact regions 24 and 26 is detected.

Still referring to FIG. 8, the resistance of the contact regions 24 and 26 can be conventionally decreased to promote better electrical contact to the resistor 20. In one embodiment, the regions 24 and 26 are conventionally silicided to form contact surfaces 34 and 36, which have a resistance of approximately 5 Ω. If the regions 24 and 26 are silicided after the spacers 32 are formed, then the resistance of intermediate regions 38 and 40 remains set by the second dopant implant as discussed above in conjunction with FIG. 4.

Therefore, referring to FIGS. 4 and 8, in the above-described embodiment of the resistor-forming process, a single mask—here the first mask 58—masks the resistor body portion 22 during both the implanting and the siliciding of the resistor contact regions 24 and 26.

After the resistor 20 is formed, the contact regions 24 and 26 are conventionally coupled to one or more other IC components such as a transistor (not shown in FIG. 8) to form a circuit.

Figure 9:
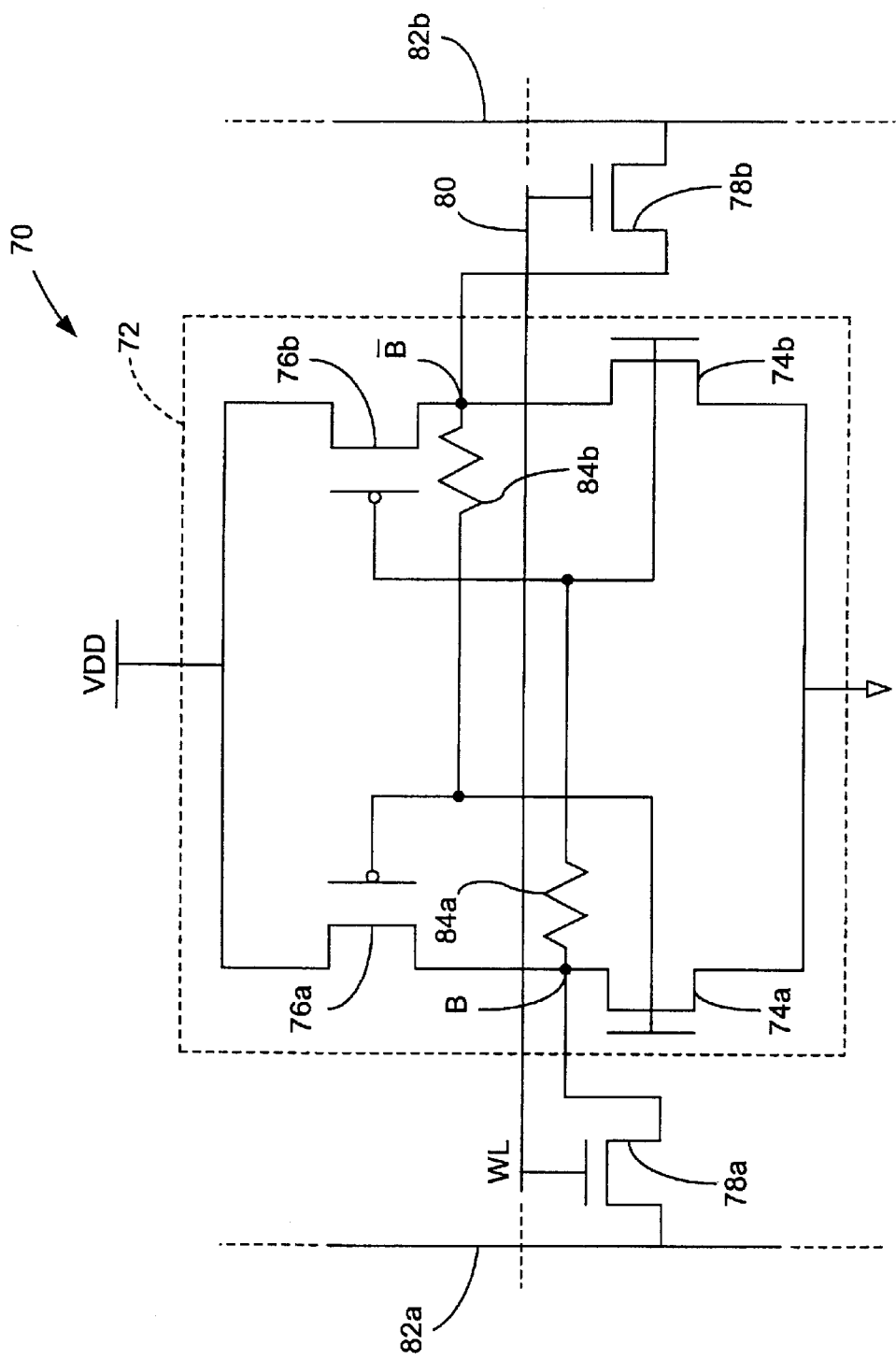
FIG. 9 is a schematic diagram of a memory cell that incorporates the resistor of FIG. 1 according to an embodiment of the invention.

FIG. 9 is a schematic diagram of a static-random-access-memory (SRAM) cell 70, which incorporates integrated resistors that are similar to the resistor 20 of FIGS. 1 and 8 according to an embodiment of the invention. The cell 70 includes a storage section 72 for storing a bit of data. The storage section 72 includes a pair of NMOS pull-down transistors 74a and 74b, which are cross-coupled with a pair of PMOS pull-up transistors 76a and 76b. The drains of the transistors 74a and 76a form a first storage node B that stores a logic value B, and the drains of the transistors 74b and 76b form a second storage node $\overline{B}$ that stores a complementary logic value $\overline{B}$. A pair of NMOS access transistors 78a and 78b have their gates coupled to a word line 80 and, in response to an active level of a signal WL, couple the storage section 72 to complementary bit lines 82a and 82b. A first resistor 84a couples the drains of the transistors 74a and 76a to the gates of the transistors 74b and 76b. Similarly, a second resistor 84b couples the drains of the transistors 74b and 76b to the gates of the transistors 74a and 76a. As discussed below, the resistors 84a and 84b reduce the chances that radiation or other disturbances will cause perturbations strong enough to toggle the state of the cell 70, thus causing it to lose the stored data bit. In one embodiment, the resistors 84a and 84b are similar to the resistor 20 of FIGS. 1 and 8.

Although the operation of the memory cell 70 is well known, a brief overview follows.

During a read of the cell 70, a read circuit (not shown in FIG. 9) transitions the signal WL carried by the word line 80 transitions from an inactive logic 0 to an active logic 1, and thus activates the transistors 78a and 78b. The active transistor 78a couples the stored logic value B to the bit line 82a, and the active transistor 78b couples the stored complementary logic value $\overline{B}$ to the complementary bit line 82b. Then, the read circuit reads the values B and $\overline{B}$ from the bit lines 82a and 82b, respectively.

During a write of the cell 70, assume for example purposes that one wishes to write B=logic 1 and $\overline{B}$=logic 0 to the cell 70. First, a write circuit (not shown in FIG. 9) drives logic 1 onto the bit line 82a and drives logic 0 onto the complementary bit line 82b. Next, the write circuit transitions WL to activate the transistors 78a and 78b, which respectively couple the bit lines 82a and 82b to the nodes B and $\overline{B}$. B=logic 1 tends to turn off the transistor 76b and tends to turn on the transistor 74b. This reinforces $\overline{B}$=logic 0. Similarly, $\overline{B}$=logic 0 tends to turn on the transistor 76a and tends to turn off the transistor 74a. This reinforces B=logic 1. Therefore, the cell 70 retains this state even after the access transistors 78a and 78b are deactivated. The resistors 84a and 84b form respective RC networks with the gate capacitances of the transistors 74b and 76b, and 74a and 76a, respectively, and thus increase the time constant associated with toggling the state of the cell 70. Thus, if B=logic 0 and $\overline{B}$=logic 1 before the above-described write cycle, then the resistors 84a and 84b increase the time it takes for B to transition from logic 0 to logic 1 and for $\overline{B}$ to transition from logic 1 to logic 0. Although this increased time constant slows down the writing of the memory cell 70 and is thus undesirable in many applications, it significantly decreases the probability that a perturbation such as radiation-induced transient will toggle the state of the cell 70. Thus, the resistors 84a and 84b harden the cell 70 for use in harsh environments such as outer space. Furthermore, because the resistors 84a and 84b occupy a reduced area like the resistor 20 of FIGS. 1 and 8, using these integrated resistors instead of conventional integrated resistors often reduces the area occupied by the cell 70.

Figure 10:
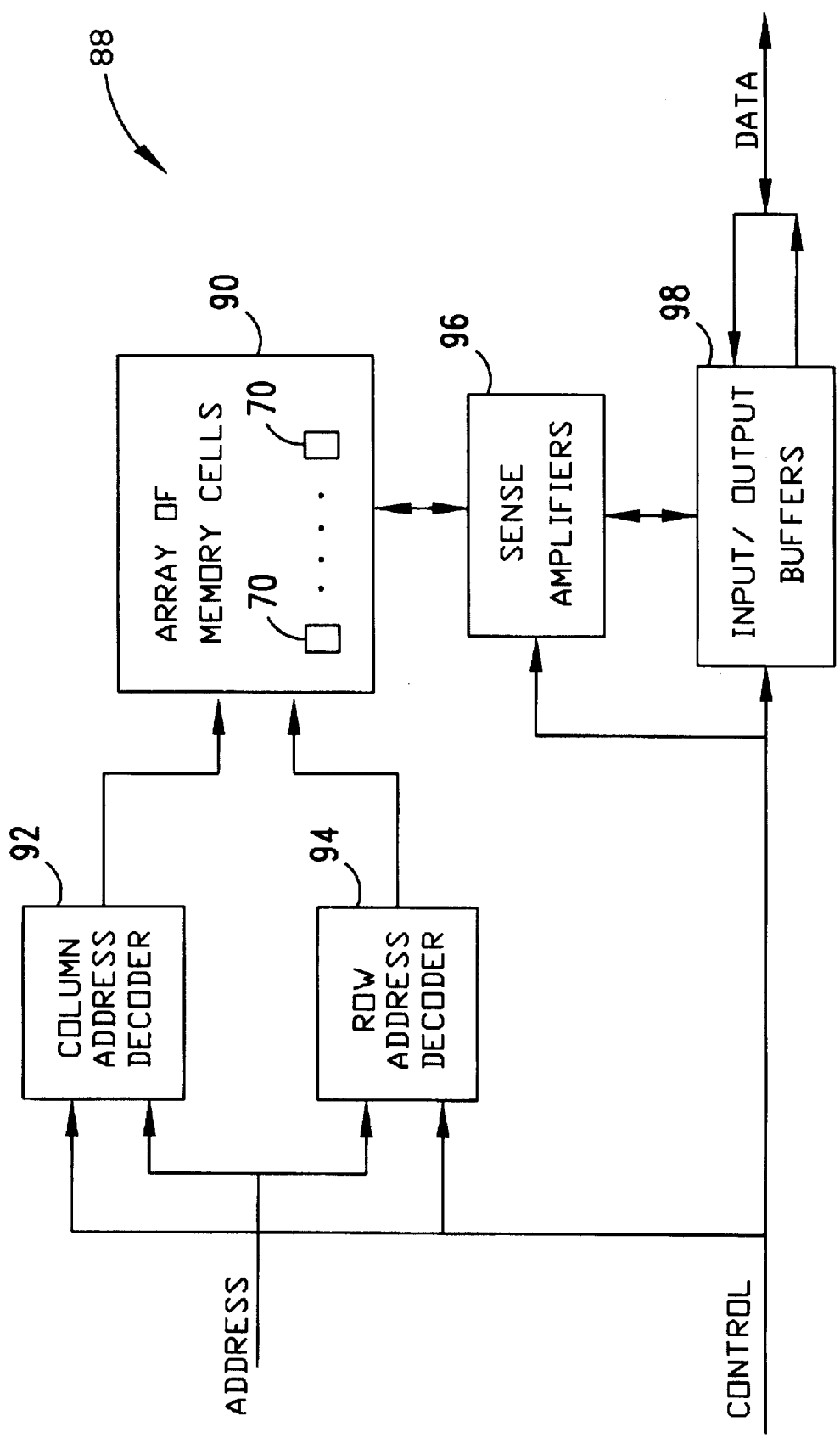
FIG. 10 is a block diagram of a memory circuit that incorporates the memory cell of FIG. 9 according to an embodiment of the invention.

FIG. 10 is a block diagram of a memory circuit 88, which includes an array 90 of one or more of the memory cells 70 of FIG. 9 according to an embodiment of the invention. A CONTROL bus receives control signals that initiate a read cycle or a write cycle. An ADDRESS bus receives an address signal that identifies the cell or cells 70 in the array 90 that are to be read from or written to. Column and row address decoders 92 and 94 receive the address signal and select the addressed cell or cells 70. During a read cycle, sense amplifiers 96 sense the data stored in the addressed cell or cells 70 and provide this sensed data to input/output buffers 98, which latch the sensed data and drive it onto a DATA bus. An external circuit (not shown) reads the data on the DATA bus. During a write cycle, the external circuit drives write data onto the DATA bus, and the input/output buffers 98 latch the write data and provide it to the sense amplifiers 96. The addressed cell or cells 70 receive and store the write data from the sense amplifiers 96. Because each of the cells 70 occupies a reduced layout area, the layout area of the array 90, and thus layout area of the memory circuit 88, can be significantly smaller than the respective layout areas of a comparable conventional memory array and memory circuit.

Figure 11:
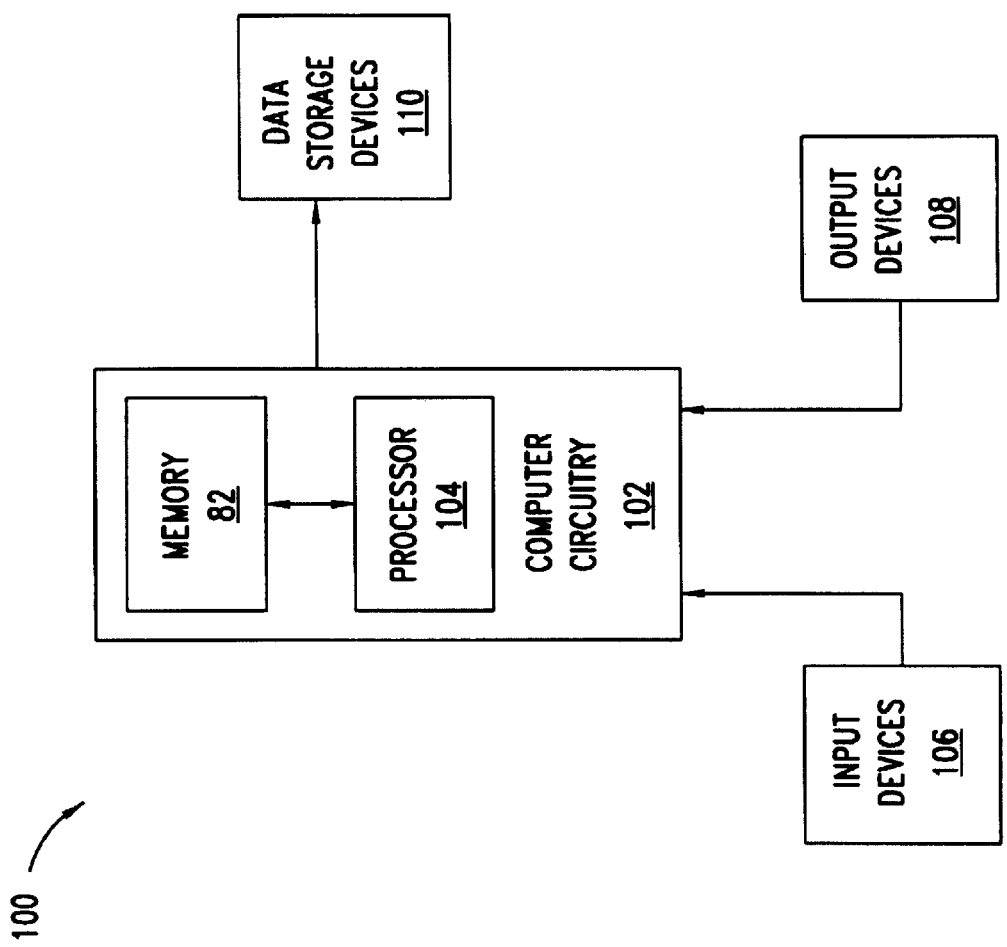
FIG. 11 is a block diagram of an electronic computer system that incorporates the memory circuit of FIG. 9 according to an embodiment of the invention.

FIG. 11 is a block diagram of an electronic system 100, such as a computer system, which includes the memory circuit 88 of FIG. 10 according to an embodiment of the invention. The system 100 includes computer circuitry 102 for performing computer functions, such as executing software to perform desired calculations and tasks. The circuitry 102 typically includes a processor 104 and the memory circuit 88, which is coupled to the processor 104. One ore more input devices 106, such as a keyboard or a mouse, are coupled to the computer circuitry 102 and allow an operator (not shown) to manually input data thereto. One or more output devices 108 are coupled to the computer circuitry 102 to provide to the operator data generated by the computer circuitry 102. Examples of such output devices 108 include a printer and a video display unit. One or more data-storage devices 110 are coupled to the computer circuitry 102 to store data or retrieve data from external storage media (not shown). Examples of the storage devices 110 and the corresponding storage media include drives that accept hard and floppy disks, tape cassettes, and compact disk read-only memories (CD-ROMs). Typically, the computer circuitry 102 includes address, data, and command buses that are respectively coupled to the ADDRESS, DATA, and COMMAND buses (FIG. 10) of the memory circuit 88.

From the foregoing it will be appreciated that, although specific embodiments of the invention have been described herein for purposes of illustration, various modifications may be made without deviating from the spirit and scope of the invention.

What is claimed is:

1. A memory circuit, comprising:

first and second supply terminals;

semiconductor layers including a resistive layer having a first portion with first and second edges;

first and second bit lines disposed in one of the semiconductor layers; and a memory cell including,
- a first transistor disposed in one of the semiconductor layers and having a first terminal coupled to the first bit line, a second terminal coupled to the second supply terminal, and a control terminal,
- a second transistor disposed in one of the semiconductor layers and having a first terminal coupled to the second bit line, a second terminal coupled to the second supply terminal, and a control terminal coupled to the first bit line, and
- a first resistor including,
  - a first contact region disposed in the first portion of the resistive layer, contiguous with the first edge of the first portion, having a first resistivity, and coupled to the control terminal of the first transistor,
  - a first intermediate region disposed in the first portion of the resistive layer, contiguous with the first edge of the first portion and with the first contact region, and having a second resistivity that is higher than the first resistivity,
  - a body region disposed in the first portion of the resistive layer, contiguous with the first and second edges of the first portion and with the first intermediate region, and having a third resistivity that is higher than the second resistivity,
  - a second intermediate region disposed in the first portion of the resistive layer, contiguous with the second edge of the first portion and with the body region, separated from the first contact and intermediate regions, and having substantially the second resistivity, and
  - a second contact region disposed in the first portion of the resistive layer, contiguous with the second edge of the first portion and with the second intermediate region, separated from the first contact and intermediate regions, having substantially the first resistivity, and coupled to the second bit line.

2. The memory circuit of claim 1 wherein:

the resistive layer has a second portion with first and second edges; and the memory cell further includes,
- a third transistor disposed in one of the semiconductor layers and electrically disposed between the first transistor and the second supply terminal, the third transistor having a first terminal coupled to the second terminal of the first transistor, a second terminal coupled to the second supply terminal, and a control terminal coupled to the control terminal of the first transistor,
- a fourth transistor disposed in one of the semiconductor layers and electrically disposed between the second transistor and the first supply terminal, the fourth transistor having a first terminal coupled to the first supply terminal, a second terminal coupled to the first terminal of the second transistor, and a control terminal coupled to the control terminal of the second transistor, and
- a second resistor disposed between the control terminals of the second and fourth transistors and the first bit line, the second resistor including
  - a first contact region disposed in the second portion of the resistive layer, contiguous with the first edge of the second portion, having substantially the first resistivity, and coupled to the control terminals of the second and fourth transistors,
  - a first intermediate region disposed in the second portion of the resistive layer, contiguous with the first edge of the second portion and with the first contact region, and having substantially the second resistivity,
  - a body region disposed in the second portion of the resistive layer, contiguous with the first and second edges of the second portion and with the first intermediate region, and having substantially the third resistivity,
  - a second intermediate region disposed in the second portion of the resistive layer, contiguous with the second edge of the second portion and with the body region, separated from the first contact and intermediate regions, and having substantially the second resistivity, and
  - a second contact region disposed in the second portion of the resistive layer, contiguous with the second edge of the second portion and with the second intermediate region, separated from the first contact and intermediate regions, having substantially the first resistivity, and coupled to the first bit line.

3. The memory circuit of claim 1, further comprising:

a semiconductor substrate; and wherein the semiconductor layers are disposed on the substrate.

4. An electronic system, comprising:

a data input device;

a data output device; and a computer circuit coupled to the data input and output devices and including an integrated circuit comprising,
- a semiconductor layer having first and second sides, and
- a resistor that includes,
  - a first contact region disposed in the semiconductor layer, contiguous with the first side of the semiconductor layer, and having a first resistivity,
  - a first intermediate region disposed in the semiconductor layer, contiguous with the first side of the semiconductor layer and with the first contact region, and having a second resistivity that is higher than the first resistivity,
  - a body region disposed in the semiconductor layer, contiguous with the first and second sides of the semiconductor layer and with the first intermediate region, and having a third resistivity that is higher than the second resistivity,
  - a second intermediate region disposed in the semiconductor layer, contiguous with the second side of the semiconductor layer and with the body region, separated from the first contact and intermediate regions, and having substantially the second resistivity, and
  - a second contact region disposed in the semiconductor layer, contiguous with the second side of the semiconductor layer and with the second intermediate region, separated from the first contact and intermediate regions, and having substantially the first resistivity.

5. The electronic system of claim 4 wherein the integrated circuit comprises a static-random-access-memory circuit.

* * * * *